United States Patent
Pai et al.

[11] Patent Number: 5,953,816
[45] Date of Patent: Sep. 21, 1999

[54] PROCESS OF MAKING INTERPOSERS FOR LAND GRIP ARRAYS

[75] Inventors: Deepak Keshav Pai; Leo Marvin Rosenstein, both of Burnsville; Lowell Dennis Lund, Eden Prairie, all of Minn.

[73] Assignee: General Dynamics Information Systems, Inc., Falls Church, Va.

[21] Appl. No.: 08/895,101

[22] Filed: Jul. 16, 1997

[51] Int. Cl.⁶ .................................................. H05K 3/36
[52] U.S. Cl. ............................. 29/879; 29/830; 29/852; 439/66; 439/67
[58] Field of Search .................................. 439/67, 66, 45, 439/74; 29/840, 830, 832, 841, 852, 879; 228/180.22

[56] References Cited

U.S. PATENT DOCUMENTS

| | | | |
|---|---|---|---|
| 3,835,531 | 9/1974 | Luttmer | 29/843 |
| 4,604,644 | 8/1986 | Beckham et al. | 257/737 |
| 4,818,728 | 4/1989 | Rai et al. | 438/108 |
| 4,965,700 | 10/1990 | McBride | 361/751 |
| 5,006,673 | 4/1991 | Freyman et al. | 174/260 |
| 5,384,952 | 1/1995 | Matsui | 29/840 |
| 5,473,510 | 12/1995 | Dozier, II | 361/719 |
| 5,477,933 | 12/1995 | Nguyen | 174/262 |
| 5,483,421 | 1/1996 | Gedney et al. | 361/768 |
| 5,491,303 | 2/1996 | Weiss | 174/262 |
| 5,525,545 | 6/1996 | Grube et al. | 29/832 X |
| 5,535,101 | 7/1996 | Miles et al. | 367/808 |
| 5,576,519 | 11/1996 | Swamy | 174/265 |
| 5,583,378 | 12/1996 | Marrs et al. | 257/710 |
| 5,640,761 | 6/1997 | DiStefano et al. | 29/830 |
| 5,673,846 | 10/1997 | Gruber | 228/180.22 |
| 5,685,885 | 11/1997 | Khandros et al. | 29/841 |
| 5,765,279 | 6/1998 | Moresco et al. | 29/840 |

*Primary Examiner*—Lee W. Young
*Assistant Examiner*—Rick Kiltae Chang
*Attorney, Agent, or Firm*—Kinney & Lange

[57] ABSTRACT

An interposer is formed by forming a laminate comprising a first sheet of electrically insulating material and a second sheet of conductive material. The first sheet has a first plurality of apertures therethrough and the second sheet is laminated to the first sheet to close the first plurality of apertures. Material is removed from the second sheet around the first plurality of apertures to form conductive pads, the pads closing the first plurality of apertures. A third sheet of electrically insulating material is attached to the second sheet. The third sheet has a second plurality of apertures therethrough, the third sheet being positioned relative to the second sheet such that the apertures of the second plurality are closed by the conductive pads. In a preferred form, the third sheet is positioned relative to the first sheet so that the apertures of the second plurality are not in registration with the apertures of the first plurality.

15 Claims, 2 Drawing Sheets

PROCESS OF MAKING INTERPOSERS FOR LAND GRIP ARRAYS

BACKGROUND OF THE INVENTION

This invention relates to interposers for connecting land grid array components, and particularly to the interposer, a process for fabricating the interposer, and the land grid array assembly including the interposer.

Circuit boards ordinarily include circuit patterns or traces printed on various levels internal to the board and/or on one or both sides of the board. Components are ordinarily mounted on one side of the board and electrically connected to the circuit patterns. Prior to the introduction of surface mount and land grid array components, it was common to mount components to a circuit board and extend leads from the components through plated-through holes in the circuit board to mounting pads on the opposite side. The plated-through holes were electrically connected to the desired locations on the circuit pattern. The component leads were ordinarily arranged in a pattern along the edges of the component with the ends of the component leads soldered to the pads on the opposite side of the board to establish mechanical and electrical connection to the board and circuit pattern.

Surface mounted components were developed for mounting and connecting to one side of the board. In one form of surface mounted components, leads extended from along the edges of the component for attachment to pads on the circuit board. In another form of surface mounted components, compliant leads were attached to pads along the edges of the component and to pads on the circuit board.

Land grid array components are a class of surface mounted components that employ a grid array of solder connections on a surface of a component. The solder connections of the grid array are not limited to the edges of the component, but instead are dispersed across the surface in spaced relation in an area array that is usually uniform. Land grid array components include ball grid array components, solder grid array components and column grid array components. The surface bearing the land grid array is positioned to confront an identical grid array of circuit pads on a circuit board, and solder beads, balls or columns are heated to reflow to attach or detach the component from the circuit board.

One difficulty with land grid array attachment techniques is that inspection of the solder connections cannot always be accomplished. More particularly, while solder beads and connections at the edges of the array might be visually inspected, it has been difficult to inspect connections at the interior of the array.

BRIEF SUMMARY OF THE INVENTION

A land grid array connection according to the invention electrically connects a circuit component to a substrate. An array of a plurality of first conductive lands are electrically connected to the component. A first flexible sheet of electrically insulating material has a plurality of first apertures arranged in an array corresponding to the array of the first conductive lands. Each of the first apertures receives one of the first conductive lands. An array of a plurality of second conductive lands are electrically connected to the substrate. A second flexible sheet of electrically insulating material has a plurality of second apertures arranged in an array corresponding to the array of the second conductive lands. Each of the second apertures receives one of the second conductive lands. A plurality of conductive pads are sandwiched between the first and second sheets. Each conductive pad is in electrical communication with a respective first land received in a respective first aperture and a respective second land received in a respective second apertures.

According to one embodiment of the land grid array, each of the first and second apertures is substantially circular and has a respective axis substantially perpendicular to the respective pad, the axes of the second apertures being out of registration with the respective axes of the first apertures.

A flexible interposer according to the present invention attaches a land grid array connection of a circuit component to a land grid array connection of a substrate. The interposer comprises a first flexible sheet of electrically insulating material having a plurality of first apertures arranged in an array to receive the lands of the land grid array of the circuit component. A second flexible sheet of electrically insulating material has a plurality of second apertures arranged in an array to receive the lands of the land grid array of the substrate. A plurality of conductive pads are sandwiched between the first and second sheets, each conductive pad being in electrical communication with a respective one of the first apertures and a respective one of the second apertures.

In one embodiment of the interposer, the first and second apertures are substantially circular and have respective axis substantially perpendicular to the respective pad; the axes of the second apertures being out of registration with the respective axes of the first apertures.

An interposer is formed according to the present invention by forming a laminate comprising a first sheet of electrically insulating material having a first plurality of apertures and a second sheet of electrically conductive material laminated to the first sheet. The first plurality of apertures are closed by the second sheet. Material of the second sheet is removed from at least around some of the first apertures to form conductive pads closing the first apertures. A third sheet of electrically insulating material is then attached to the second sheet, the third sheet having a second plurality of apertures. The third sheet is positioned relative to the second sheet such that the apertures of the second plurality are closed by the conductive pads.

According to one embodiment of the process, the third sheet is positioned relative to the first sheet so that the apertures of the second plurality are not in registration with the apertures of the first plurality.

According to another embodiment of the process, the laminate is formed by laminating the first sheet to the second sheet, and subsequently drilling the first plurality of apertures through the first sheet without drilling through the second sheet. The apertures of the first plurality are substantially circular and have axes perpendicular to a plane of the laminate.

According to another embodiment of the process the laminate is formed by forming the first plurality of apertures through the first sheet; the apertures of the first plurality being substantially circular, and subsequently laminating the first sheet to the second sheet so that the apertures of the first plurality have axes perpendicular to a plane of the laminate.

According to another embodiment of the process the third sheet is attached to the second sheet by bonding a sheet of electrically insulating material to the second sheet with an adhesive, and laser drilling the second plurality of apertures in the third sheet so that material displaced by the drilling process fills voids in the second sheet left by removal of material of the second sheet to form the pads.

DETAILED DESCRIPTION OF THE PREFERRED EMBODIMENTS

Figure 1A:
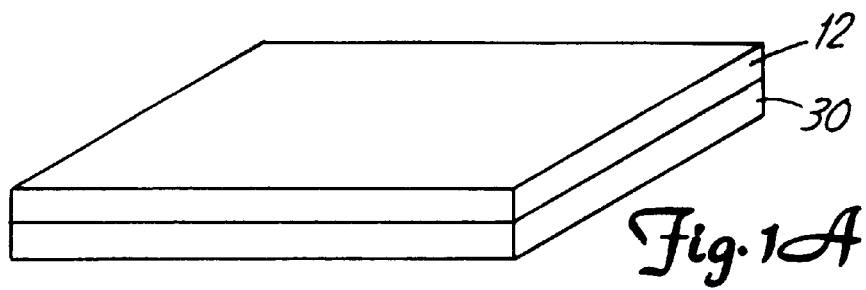
FIGS. 1A–1E illustrate the process for fabricating the interposer according to the present invention.
Figure 1B:
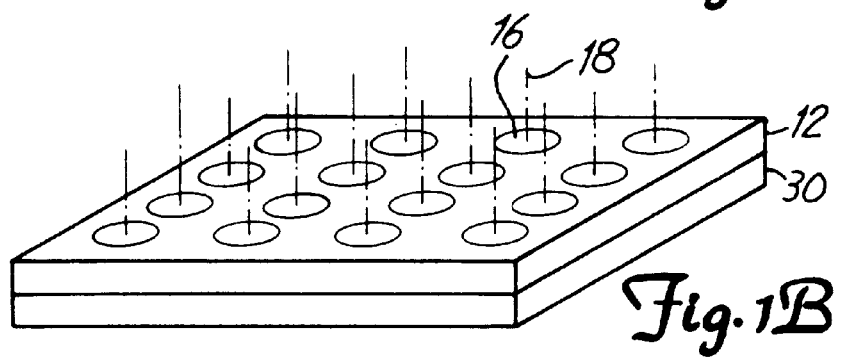
Figure 1C:
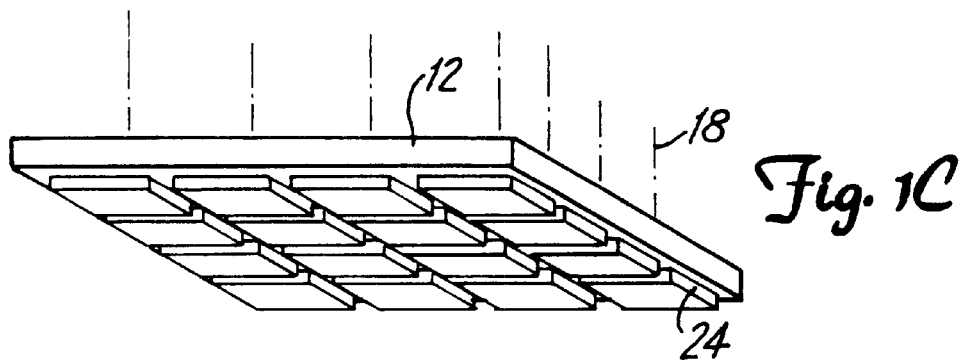
Figure 1D:
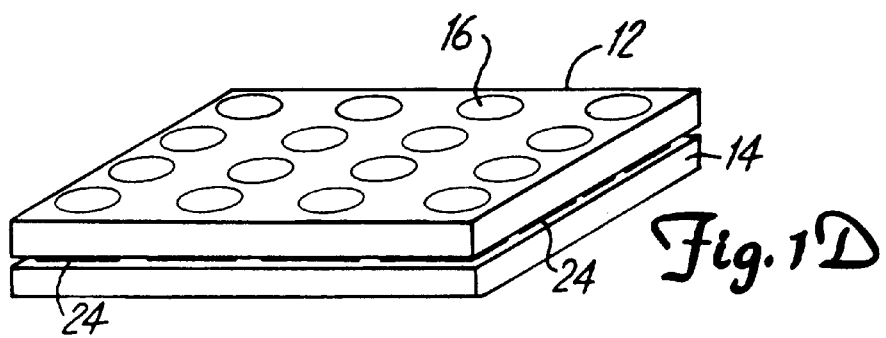
Figure 1E:
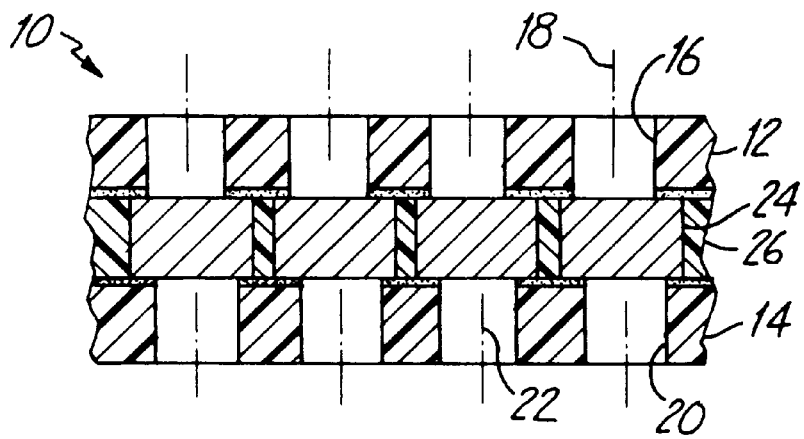

FIGS. 1A–1E illustrate a preferred form of the process for forming interposer 10 in accordance with the presently preferred embodiment of the present invention, FIG. 1E being a section view of the completed interposer. As shown in FIG. 1E, the completed interposer comprises a layer 12 of electrically insulating material, such as polyimide, and a layer 14 also electrically insulating material, such as polyimide. A plurality of first apertures 16 extend through layer 12. Apertures 16 are arranged in a pattern conforming to the land grid array of the land grid array component to which the interposer is to be used. Preferably, apertures 16 are circular and are centered on axes 18, perpendicular to the interposer. Likewise, bottom layer 14 includes a plurality of second apertures 20 extending therethrough, centered on axes 22, also perpendicular to the interposer. A plurality of conductive pads 24 are sandwiched between layers 12 and 14, and are separated by insulating material 26, such as polyimide. Each pad 24 closes the internal end of a respective aperture 16 and 20, such that a single pad 24 provides a conductive path between respective single apertures 16 and 20. One particularly useful feature of the invention resides in the fact that axes 18 and 22 are not in registration, but instead are offset from each other. This feature permits inspection of the interposer and of the grid array component connection.

Interposer 10 is formed by laminating a layer 12 of polyimide to copper layer 30 (FIG. 1A). A plurality of apertures 16 are formed in layer 12. Apertures 16 may be formed before lamination of layer 12 to layer 30, or may be laser-drilled subsequent to lamination. Because laser-drilling removes adhesive, laser-drilling is preferred over pre-drilling to make certain that the interface between each aperture 16 and layer 30 is clean and free of debris. Laser-drilling is adjusted such that copper layer 30 is not significantly drilled.

Upon completion of the lamination and formation of apertures 16, the assemblage is as shown in FIG. 1B with an array of apertures 16 conforming to the land grid array of the desired component, each aperture being circular in section and having an axis 18 perpendicular to the plane of copper layer 30. Next, and as shown in FIG. 1C, copper layer 30 is patterned to form a plurality of copper pads 24. Preferably, copper layer is etched to remove copper material from between the pads, and at the edges. The result is such that each pad 24 closes a respective aperture 16. Preferably, each pad 24 is rectangular or square in geometry, with a smallest side dimension larger than the diameter of the respective aperture 16. As shown particularly in FIG. 1D, a layer 14 of electrically insulative material, such as polyimide, is adhesively bonded to the exposed surfaces of pads 24. An array of apertures 20 are laser-drilled into and through layer 14 to expose a surface of each pad 24. As shown particularly in FIG. 1E, the axis 22 of each aperture 20 is preferably out of registration from the respective axis 18 of the aperture confronting the opposite side of the respective pad 24. Laser-drilling of apertures 20 heats the polyimide and adhesive material of layer 14 so that some of the excess material 26 flows into the space in copper layer 30 that had been etched away to form the pads 25. Thus, the excess material 26 flowed into spaces provides additional structural integrity to the completed interposer.

Figure 2:
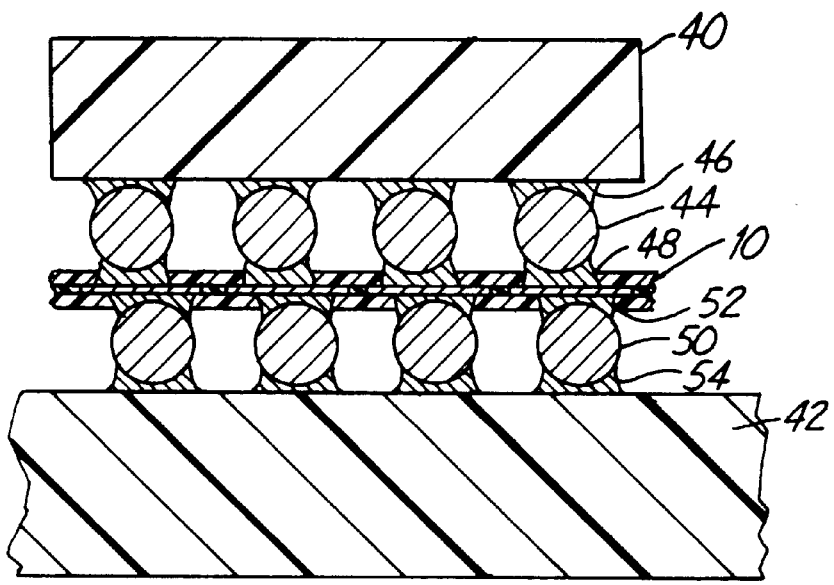
FIG. 2 is a section view illustrating a land grid array component attached to a printed wiring board employing an interposer in accordance with the present invention.

FIG. 2 is a section view illustrating the use of interposer 10 to connect a ball grid array component 40 to a ball grid array connection scheme on a printed wiring board 42. More particularly, a first ball grid array comprising conductive spheres 44 are solder-attached to component 40 using a suitable solder 46. Spheres 44 are then solder-attached to aperture 16 of interposer 10 using solder 48. Next, solder spheres 50 are attached to interposer 10 at apertures 20 using a high temperature solder 52. Finally, the spheres 50 of the ball grid array attached to interposer 10 are soldered to pads on printed wiring board 24 using solder 54. By way of example, solder connections 46, 48, and 54 may be low temperature tin/lead (63:37) solder, solder connection 52 may be a high temperature tin/silver (96.5:3.5) solder. Spheres 44 may be a high temperature tin/lead (10:90) solder and spheres 50 may be a high temperature tin-lead (10:90) solder or copper.

In a preferred embodiment of the present invention, each of the polyimide layers 12 and 14 has a thickness between about 0.001 and 0.002 inches, and the copper layer is a thin copper foil having a thickness between about 0.0005 and 0.002 inches. As a result, the entire laminated structure of the interposer 10 is highly flexible allowing it to conform to the land grid arrays to which it is to be attached. Thus, the interposer will adjust for any minor lack of planarity of the spheres of either land grid array connection. For a land grid array pattern having a 0.50 inch pitch, apertures 16 and 20 have diameters of approximately 0.028 inches, centered on the 0.50 inch pitch. For land grid array patterns having a 0.40 pitch, apertures 16 and 20 have diameters of approximately 0.23 inches centered on the 0.40 pitch. Preferably, copper pads 24 are square etched to a size of 0.40 inch square for a 0.50 inch pitch, and 0.032 inch square for 0.40 inch pitch. Thus, a 0.010 inch spacing is provided between pads 24 for a 0.50 inch pitch and a 0.008 inch spacing appears between pads 24 for a 0.040 inch pitch. Where the axes 18 and 22 of apertures 16 and 20 are offset, as in a preferred embodiment of the invention, the axes are offset by about 0.004 inches.

The present invention thus provides an interposer for use in connection with land grid array connections between land grid array components and printed wiring boards, and the like. A feature of the invention resides in the fact that the connection to the land grid array component 40 and a connection to the printed wiring board 42 are offset from each other thereby permitting inspection of the completed connector. More particularly, X-ray inspection through either the component or the printed wiring board may be accomplished to view the connections of the land grid array connectors. By offsetting the axes 18 and 22 of apertures 16 and 20 by a distance of about 0.004 inches, adequate surface area of the pads 24 to close the respective apertures 16 and 20 is provided and adequate offset is provided to permit X-ray inspection of the connection.

Although the present invention has been described with reference to preferred embodiments, workers skilled in the art will recognize that changes may be made in form and detail without departing from the spirit and scope of the invention.

We claim:

1. A process for forming an interposer, comprising:

forming a laminate comprising a first sheet of electrically insulating material having a top surface and plurality of first apertures therethrough and a second sheet of electrically conductive material laminated to a bottom surface of the first sheet, the first apertures being closed by the second sheet;

removing material of the second sheet around at least some of the first apertures to form conductive pads that closes the at least some of the first apertures so that the conductive pads are in electrical communication with respective first apertures;

attaching a third sheet of electrically insulating material to a side of the second sheet opposite the first sheet; and displacing material from the third sheet to form a plurality of second apertures in the third sheet and the material displaced from the third sheet fills voids in the second sheet left by removal of material of the second sheet to form the pads, the second apertures are closed by the conductive pads so that each conductive pad is in electrical communication with a respective second aperture.

2. The process of claim 1 wherein the third sheet is positioned relative to the first sheet so that the second apertures are not in registration with the first apertures.

3. The process of claim 1 wherein the laminate is formed by laminating the first sheet to the second sheet, and subsequently drilling the first apertures through the first sheet without drilling through the second sheet, the first apertures are substantially circular and have axes perpendicular to the top surface of the first sheet.

4. The process of claim 3 wherein the step of drilling the first apertures is performed by laser drilling.

5. The process of claim 3 wherein the step of removing material of the second sheet is performed by etching.

6. The process of claim 3 wherein the step of attaching a third sheet to the second sheet comprises bonding a sheet of electrically insulating material to the second sheet with an adhesive, and the step of forming a plurality of second apertures comprises laser drilling the plurality of second apertures in the third sheet, the second apertures are substantially circular and have axes perpendicular to the top surface of the first sheet.

7. The process of claim 6 wherein the step of drilling the first apertures is performed by laser drilling.

8. The process of claim 6 wherein the step of removing material of the second sheet is performed by etching.

9. The process of claim 6 wherein the third sheet is positioned relative to the first sheet so that the axes of the second apertures are out of registration with the axes of the first apertures.

10. The process of claim 1 wherein the laminate is formed by forming the plurality of first apertures through the first sheet, the first apertures are substantially circular, and subsequently laminating the first sheet to the second sheet so that the first apertures have axes perpendicular to the top surface of the first sheet.

11. The process of claim 10 wherein the step of removing material of the second sheet is performed by etching.

12. The process of claim 10 wherein the third sheet is positioned relative to the first sheet so that the second apertures are not in registration with the first apertures.

13. The process of claim 10 wherein the step of attaching a third sheet to the second sheet comprises bonding a sheet of electrically insulating material to the second sheet with an adhesive, and the step of forming a plurality of second apertures comprises laser drilling the plurality of second apertures in the third sheet, the second apertures are substantially circular and have axes perpendicular to the top surface of the first sheet.

14. The process of claim 13 wherein the third sheet is positioned relative to the first sheet so that the axes of the second apertures are out of registration with the axes of the first apertures.

15. The process of claim 13 wherein the step of removing material of the second sheet is performed by etching.

\* \* \* \* \*